United States Patent
Hasenplaugh et al.

(10) Patent No.: US 7,827,471 B2
(45) Date of Patent: Nov. 2, 2010

(54) DETERMINING MESSAGE RESIDUE USING A SET OF POLYNOMIALS

(75) Inventors: William C. Hasenplaugh, Jamaica Plain, MA (US); Brad A. Burres, Waltham, MA (US); Gunnar Gaubatz, Worcester, MA (US)

(73) Assignee: Intel Corporation, Santa Clara, CA (US)

( * ) Notice: Subject to any disclaimer, the term of this patent is extended or adjusted under 35 U.S.C. 154(b) by 1027 days.

(21) Appl. No.: 11/581,055

(22) Filed: Oct. 12, 2006

(65) Prior Publication Data

US 2008/0092020 A1  Apr. 17, 2008

(51) Int. Cl.
  *H03M 13/00*  (2006.01)
(52) U.S. Cl. ...................... 714/781; 714/758
(58) Field of Classification Search ................. 714/781, 714/758
  See application file for complete search history.

(56) References Cited

U.S. PATENT DOCUMENTS

| | | | |
|---|---|---|---|
| 3,980,874 A | 9/1976 | Vora | |
| 4,945,537 A * | 7/1990 | Harada | 714/781 |
| 4,949,294 A | 8/1990 | Wambergue | |
| 4,979,174 A * | 12/1990 | Cheng et al. | 714/774 |
| 5,166,978 A | 11/1992 | Quisquater | |
| 5,363,107 A * | 11/1994 | Gertz et al. | 342/26 B |
| 5,384,786 A * | 1/1995 | Dudley et al. | 714/784 |
| 5,642,367 A * | 6/1997 | Kao | 714/784 |
| 5,768,296 A * | 6/1998 | Langer et al. | 714/784 |
| 5,942,005 A * | 8/1999 | Hassner et al. | 714/784 |
| 6,038,577 A * | 3/2000 | Burshtein | 708/252 |
| 6,128,766 A * | 10/2000 | Fahmi et al. | 714/807 |
| 6,223,320 B1 | 4/2001 | Dubey et al. | |
| 6,484,192 B1 * | 11/2002 | Matsuo | 708/492 |
| 6,609,410 B2 | 8/2003 | Axe et al. | |
| 6,721,771 B1 * | 4/2004 | Chang | 708/492 |
| 6,728,052 B2 * | 4/2004 | Kondo et al. | 360/53 |
| 6,732,317 B1 | 5/2004 | Lo | |
| 6,795,946 B1 | 9/2004 | Drummond-Murray et al. | |
| 6,904,558 B2 | 6/2005 | Cavanna et al. | |
| 7,058,787 B2 | 6/2006 | Brognara et al. | |
| 7,171,604 B2 * | 1/2007 | Sydir et al. | 714/758 |
| 7,190,681 B1 * | 3/2007 | Wu | 370/316 |
| 7,243,289 B1 | 7/2007 | Madhusudhana et al. | |

(Continued)

FOREIGN PATENT DOCUMENTS

WO  2006016857 A1  2/2006

(Continued)

OTHER PUBLICATIONS

International Preliminary Report on Patentability for PCT Patent Application No. PCT/US2007/081312, mailed on Apr. 7, 2008, 4 pages.

(Continued)

*Primary Examiner*—M. Mujtaba K Chaudry (57) ABSTRACT

A method is described for use in determining a residue of a message. The method includes loading at least a portion of each of a set of polynomials derived from a first polynomial, $g(x)$, and determining the residue using a set of stages. Individual ones of the stages apply a respective one of the derived set of polynomials to data output by a preceding one of the set of stages.

17 Claims, 6 Drawing Sheets

U.S. PATENT DOCUMENTS

| | | | |
|---|---|---|---|
| 7,343,541 B2 * | 3/2008 | Oren | 714/758 |
| 7,428,693 B2 | 9/2008 | Obuchi et al. | |
| 7,458,006 B2 | 11/2008 | Cavanna et al. | |
| 7,461,115 B2 | 12/2008 | Eberle, Hans et al. | |
| 7,543,214 B2 | 6/2009 | Ricci | |
| 2002/0053232 A1 | 5/2002 | Axe et al. | |
| 2002/0144208 A1 | 10/2002 | Gallezot et al. | |
| 2003/0167440 A1 * | 9/2003 | Cavanna et al. | 714/781 |
| 2003/0202657 A1 | 10/2003 | She | |
| 2003/0212729 A1 | 11/2003 | Eberle et al. | |
| 2004/0059984 A1 | 3/2004 | Cavanna et al. | |
| 2004/0083251 A1 | 4/2004 | Geiringer et al. | |
| 2005/0044134 A1 | 2/2005 | Krueger et al. | |
| 2005/0138368 A1 | 6/2005 | Sydir et al. | |
| 2005/0149725 A1 | 7/2005 | Sydir et al. | |
| 2005/0149744 A1 | 7/2005 | Sydir et al. | |
| 2005/0149812 A1 | 7/2005 | Hall et al. | |
| 2005/0154960 A1 * | 7/2005 | Sydir et al. | 714/758 |
| 2006/0059219 A1 | 3/2006 | Koshy et al. | |
| 2006/0282743 A1 | 12/2006 | Kounavis | |
| 2006/0282744 A1 | 12/2006 | Kounavis | |
| 2007/0083585 A1 | 4/2007 | St Denis et al. | |
| 2007/0150795 A1 | 6/2007 | King et al. | |
| 2007/0297601 A1 | 12/2007 | Hasenplaugh et al. | |
| 2008/0092020 A1 | 4/2008 | Hasenplaugh et al. | |
| 2009/0157784 A1 | 6/2009 | Gopal et al. | |
| 2009/0158132 A1 | 6/2009 | Gopal et al. | |

FOREIGN PATENT DOCUMENTS

| | | |
|---|---|---|
| WO | 2008/002828 A2 | 1/2008 |
| WO | 2008/002828 A3 | 2/2008 |
| WO | 2008046078 A2 | 4/2008 |
| WO | 2008046078 A3 | 4/2008 |
| WO | 2009/012050 A2 | 1/2009 |
| WO | 2009/012050 A3 | 3/2009 |
| WO | 2009/082598 A1 | 7/2009 |
| WO | 2009/085489 A2 | 7/2009 |
| WO | 2009/085489 A3 | 8/2009 |

OTHER PUBLICATIONS

International Search Report/Written Opinion for PCT Patent Application No. PCT/US2007/081312, mailed on Apr. 7, 2008, 9 Pages.
International Search Report/Written Opinion for PCT Patent Application No. PCT/US2008/085284, mailed on May 18, 2009, pp. 11.
Hasenplaugh, W. et al., "Fast Modular Reduction", Proceedings of the 18th IEEE Symposium on Computer Arithmetic, Jun. 25-27, 2007, pp. 225-229.
Kounavis, M. E., et al., "Novel Table Lookup-Based Algorithms for High-Performance CRC Generation", IEEE Transactions on Computers, vol. 57, No. 11, Nov. 2008, pp. 1550-1560.
International Search Report & Written Opinion for Application No. PCT/US2007/071829, mailed on Dec. 12, 2007, 10 Pages.
Antoon, B. et al., "Comparison of three modular reduction function", Comparative Description and Evaluation, Oct. 25, 1993, pp. 13.
Chin, B. L., et al., "Design and Implementation of Long-Digit Karatsuba's Multiplication Alogorithm Using Tensor Product Formulation", Workshop on Compiler Techniques for High Performance Computing, 2003, 8 Pages.
International Preliminary Report on Patentability for PCT Patent Application No. PCT/US2007/071829, mailed on Jan. 15, 2009, 7 pages.
Nedjah, N. et al., "A Review of Modular Multiplication Methods and Respective Hardware Implementation", Informatica, vol. 30, No. 1, 2006, pp. 20.
Nedjah, N. et al., "A reconfigurable recursive and efficient hardware for Karatsuba-Ofman's multiplication algorithm", Retrieved on Apr. 16, 2010, Available at: http://ieeexplore.ieee.org/Xplore/login.jsp?url=http%3A%2F%2Fieeexplore.ieee.org%2Fiel5%2F8665%2F27464%2F01223160.pdf%3Farnumber%3D1223160&authDecision=-203.
International Search Report/Written Opinion for Patent Application No. PCT/US2008/084571, mailed Jun. 18, 2009, 11 pages.
International Search Report/ Written Opinion for PCT Patent Application No. PCT/US2008/068801, mailed on Dec. 31, 2008, 10 pages.
Barrett: Implementing the Rivest Shamir and Adleman Public Key Encryption Algorithm on a Standard Digital Signal Processor; Computer Security LTD Aug. 1986, 13 pages (Crypto '86, LNCS 263, pp. 311-323, 1987; copyright Springer-Verlag Berlin Heidelberg 1987).
Dhem: Design of an Efficient Public-Key Cryptographic Library for RISC-Based Smart Cards; Faculte Des Sciences appliquees Laboratoire de Microelectronique; Louvain-la-Neuve, Belgium, May 1998, 198 pages.
Fischer et al: Duality Between Multiplicatio and Modular Reduction; Infineon Technologies AG, Secure Mobile Solutions, Munich, Germany; Intel Corp., Systems Tech. Labl, Hillsboro, OR; pp. 1-13, 2005.
Koc et al: Analyzing and Comparing Montgomery Multiplication Algorithms; IEEE Micro, 16(3): 26-33, Jun. 1996; Dep't of Electrical & Computer Engineering, OSU, Corvallis, Oregon,; pp. 1-18.
Montgomery: Five, Six, and Seven-Term Karatsuba-Like Formulae; IEEE Transactions on Computers, vol. 54, No. 3, Mar. 2005, 8 pages.
Montgomery: Modular Multiplication Without Trial Division; Mathematics of Computation, vol. 44, No. 170, Apr. 1985, pp. 519-521.
Number Theory and Public Key Cryptography; Introduction to Number Theory, pp. 1-14, 1996.
Phatak et al: Fast Modular Reduction for Large Wordlenghts via One Linear and One Cyclic Convolution, Computer Science & Electrical Engineering Dep't, Univ. of Mayland, Baltimore, MD; 8 pages, 2005.
Sedlak: The RSA Cryptography Processor; Institut fur Theoretische Informatik, Germany, Copyright 1998, Springer-Verlag, pp. 95-105, 14 pages total.
Tenca et al: A Scalable Architecture for Montgomery Multiplication; Electrical & Computer Engineering; OSU, Corvallis, OR,; Cryptographic Hardware and Embedded Systems, CHES 99, C.K. Koc et al, Lecture Notes in computer Science, No. 1717, pages 94-108, New York, NY: Springer-Verlag, 1999.
Weimerskirch et al: Generalizations of the Karatsuba Algorithm for Polynomial Multiplication; communication Security Group, Dep't of Electrical Engineering & Info. Sciences, Bochum, Germany, Mar. 2002; pp. 1-23.
Ramabadran et al.: A Tutorial on CRC Computations; Aug. 1998 IEEE (Dep't of EE&CE, Iowa), pp. 62-74, 14 pages total.
Lin et al: High-Speed CRC Design for 10 Gbps applications; ISCAS 2006, IEEE, (Dep't of Electrical Engineering, Taiwan, ROC), pp. 3177-3180, 4 pages total.
Williams: A Painless Guide to CRC Error Detection Algorithms Version 3; Aug. 19, 2003; Copyright Ross Williams, 1993; 37 pages.
Sprachmann: Automatic Generation of Parallel CRC Circuits; Generation of Parallel Circuits; IEEE Design & Test of Computers May-Jun. 2001; pp. 108-114, 7 pages total.
Koopman et al.: cyclic Redundancy Code (CRC) Polynomial Selection for Embedded Networks; Preprint: The In'tl Conference on Dependable Systems and Networks, DSN-2004 pp. 1-10.
Campobello et al.: Parallel CRC Realization; IEEE Transactions on Computers, vol. 52, No. 10, Oct. 2003; Published by the IEEE Computer Society; pp. 1312-1319, 8 pages total.
Kounavis et al.: A Systematic Approach to Building High Performance Software-based CRC Generators; Proceedings of the 10th IEEE Symposium on Computers and Communications (ISCC 2005); 8 pages.

* cited by examiner

DETERMINING MESSAGE RESIDUE USING A SET OF POLYNOMIALS

BACKGROUND

Data transmitted over network connections or retrieved from a storage device, for example, may be corrupted for a variety of reasons. For instance, a noisy transmission line may change a "1" signal to a "0", or vice versa. To detect corruption, data is often accompanied by some value derived from the data such as a checksum. A receiver of the data can recompute the checksum and compare with the original checksum to confirm that the data was likely transmitted without error.

A common technique to identify data corruption is known as a Cyclic Redundancy Check (CRC). Though not literally a checksum, a CRC value can be used much in the same way. That is, a comparison of an originally computed CRC and a recomputed CRC can identify data corruption with a very high likelihood. CRC computation is based on interpreting message bits as a polynomial, where each bit of the message represents a polynomial coefficient. For example, a message of "1110" corresponds to a polynomial of $x^3+x^2+x+0$. The message is divided by another polynomial known as the key. For example, the other polynomial may be "11" or $x+1$. A CRC is the remainder of a division of the message by the key. CRC polynomial division, however, is somewhat different than ordinary division in that it is computed over the finite field GF(2) (i.e., the set of integers modulo 2). More simply put: even number coefficients become zeroes and odd number coefficients become ones.

A wide variety of techniques have been developed to perform CRC calculations. A first technique uses a dedicated CRC circuit to implement a specific polynomial key. This approach can produce very fast circuitry with a very small footprint. The speed and size, however, often come at the cost of inflexibility with respect to the polynomial key used. Additionally, supporting multiple keys may increase the circuitry footprint nearly linearly for each key supported.

A second commonly used technique features a CRC lookup table where, for a given polynomial and set of data inputs and remainders, all possible CRC results are calculated and stored. Determining a CRC becomes a simple matter of performing table lookups. This approach, however, generally has a comparatively large circuit footprint and may require an entire re-population of the lookup table to change the polynomial key being used.

A third technique is a programmable CRC circuit. This allows nearly any polynomial to be supported in a reasonably efficient amount of die area. Unfortunately, this method can suffer from much slower performance than the previously described methods.

DETAILED DESCRIPTION

Figure 1:
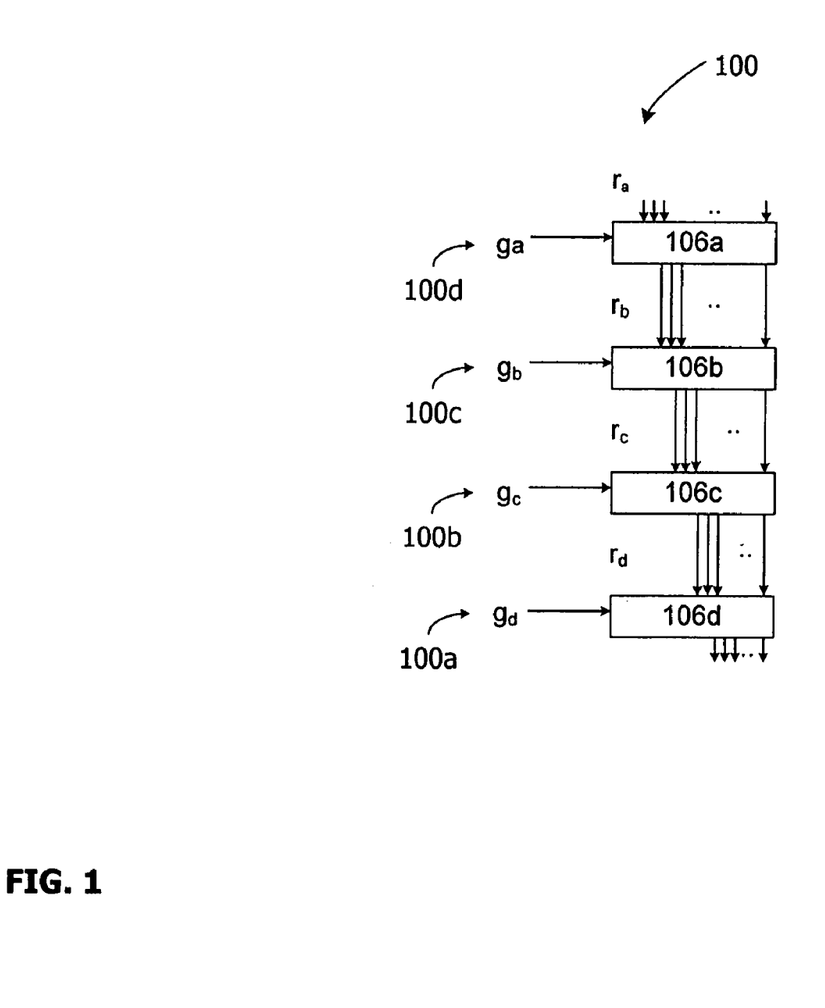
FIG. 1 is a diagram illustrating a set of stages that apply a set of pre-computed polynomials to determine a polynomial division residue.

FIG. 1 illustrates a sample implementation of a programmable Cyclic Redundancy Check (CRC) circuit 100. The circuit 100 can achieve, roughly, the same performance as a lookup table CRC implementation and may be only modestly slower than a dedicated CRC circuit implementation operating on a typical polynomial. From a die-area perspective, the circuit 100 can be orders of magnitude smaller than a lookup table approach and within an order of magnitude of a dedicated circuit implementation.

The circuit 100 uses a series of pre-computed polynomials 100a-100d derived from a polynomial key. Bits of the pre-computed polynomials 100a-100d are loaded into storage elements (e.g., registers or memory locations) and fed into a series of stages 106a-106d that successively reduce an initial message into smaller intermediate values en route to a final CRC result output by stage 106d. For example, as shown, the width of data, $r_b$-$r_d$, output by stages 106a-106d decreases with each successive stage. The pre-computed polynomials 100a-100d and stages 106d-106a are constructed such that the initial input, $r_a$, and the stage outputs, $r_b$-$r_d$, are congruent to each other with respect to the final residue (i.e., $r_a \equiv r_b \equiv r_c \equiv r_d$). In addition, the pre-computed polynomials 100a-100d permit the stages 106a-106d to perform many of the calculations in parallel, reducing the number of gate delays needed to determine a CRC residue. Reprogramming the circuitry 110 for a different key can simply be a matter of loading the appropriate set of pre-computed polynomials into the storage elements 100a-100d.

Figure 2:
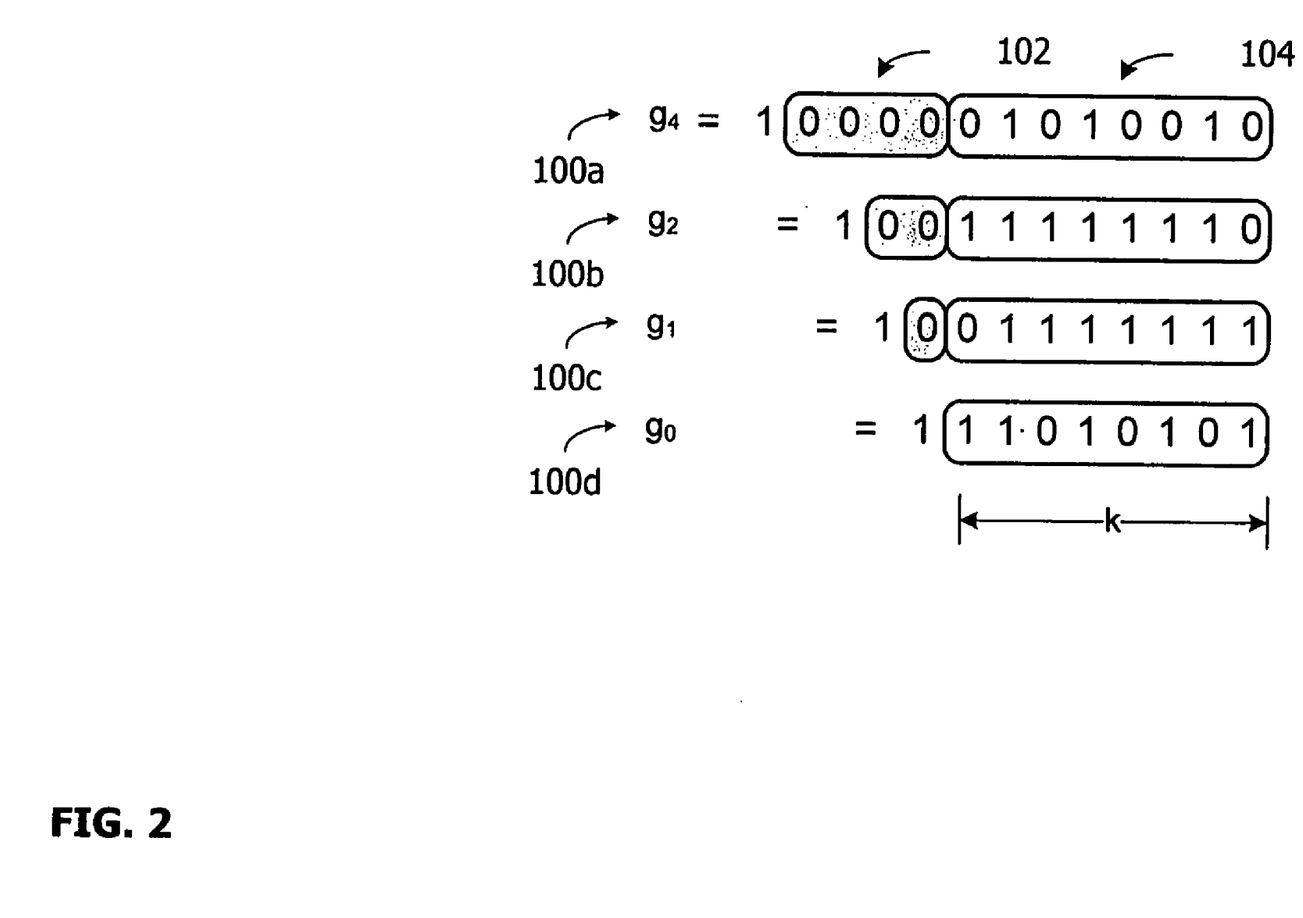
FIG. 2 is a diagram of a set of pre-computed polynomials.

FIG. 2 illustrates a sample set of pre-computed polynomials, $g_i(x)$, 100a-100d (e.g., $g_4$, $g_2$, $g_1$, and $g_0$). By examination, these polynomials 100a-100d have the property that each successive polynomial 100a-100d in the set features a leading one bit (i+kth bit) followed by followed by i-zeroes 102 (shaded) and concluding with k-bits of data 104 of the order of the generating (CRC) polynomial (e.g., $g_0$). The form of these polynomials 100a-100d enables each stage 106a-106d to reduce input data to a smaller, but CRC equivalent, value. For example, after deriving a set of polynomials {$g_4(x)$, $g_2(x)$, $g_1(x)$} from some 9-bit polynomial $g_0(x)$, a CRC could be determined for input data of 16-bits. During operation, applying $g_4(x)$ would reduce the input data from 16-bits to 12-bits, $g_2(x)$ would reduce the next the data from 12-bits to 10-bits, and so forth until an 8-bit residue was output by a final stage 106d. Additionally, as described in greater detail below, a given stage 106a-106d may use a polynomial 100a-100d to process mutually exclusive regions of the input data in parallel.

More rigorously, let $g(x)$ be a $k^{th}$-degree CRC polynomial of k+1 bits, where the leading bit is always set in order that the residue may span k bits. The polynomial $g(x)$ is defined as $$g(x) = \left[ x^k + \sum_{i=0}^{k-1} g_i x^i \right]$$

$$g_j \in GF(2)$$

The polynomial $g_i(x)$ is then defined as:

$$g_i(x) = x^{k+i} + [x^{k+i} \bmod g(x)]$$

In accordance with this definition of $g_i(x)$, a sequence of polynomials can be computed as a function of selected values of i and the original polynomial $g(x)$.

The CRC polynomial, g(x), divides $g_i(x)$:

$g(x)|g_i(x)$ proof $$g_i(x) = x^{k+i} + [x^{k+i} \bmod g(x)]$$
$$= x^{k+i} + [x^{k+i} - a_i(x)g(x)] - \text{for some } a_i(x)$$
$$= a_i(x)g(x)$$

From this, a recurrence can be defined, where at each stage a message, m(x), is partially reduced by one of the pre-computed polynomials.

Let m(x) be a $2^L$ bit message and r(x) be the k-bit result:

$r_j, m_j \in GF(2)$ $r(x) = [m(x) \cdot x^k \bmod g(x)]$ where m(x) is shifted by $x^k$, creating room to append the resulting CRC residue to the message, m(x). Thus:

$r_0(x) = m(x) \cdot x^k$ $r_i(x) = [r_{i-1}(x) \bmod g_{2^{L-i}}(x)]$ for $i \geq 1$. Thus, $r_i(x) \equiv r_0(x) \bmod g(x)$, which is proved by induction on i:

$r_1(x) \equiv r_0(x) \bmod g(x)$ proof $$r_1(x) = r_0(x) \bmod g_{2^{L-1}}(x)$$
$$= r_0(x) \bmod [a_{2^{L-1}}(x)g(x)]$$

$r_i(x) \equiv r_{i-1}(x) \bmod g(x)$ proof $$r_i(x) = r_{i-1}(x) \bmod g_{2^{L-i}}(x)$$
$$= r_{i-1}(x) \bmod [a_{2^{L-i}}(x)g(x)]$$

Finally, $r_L(x) = r(x)$, which follows from the observations made above:

$$r_L(x) = [r_{L-1}(x) \bmod g_0(x)]$$
$$= [m(x) \cdot x^k - b(x) \cdot g(x)] \bmod g_0(x) - \text{for some } b(x)$$
$$= m(x) \cdot x^k \bmod g(x)$$

Figure 3:
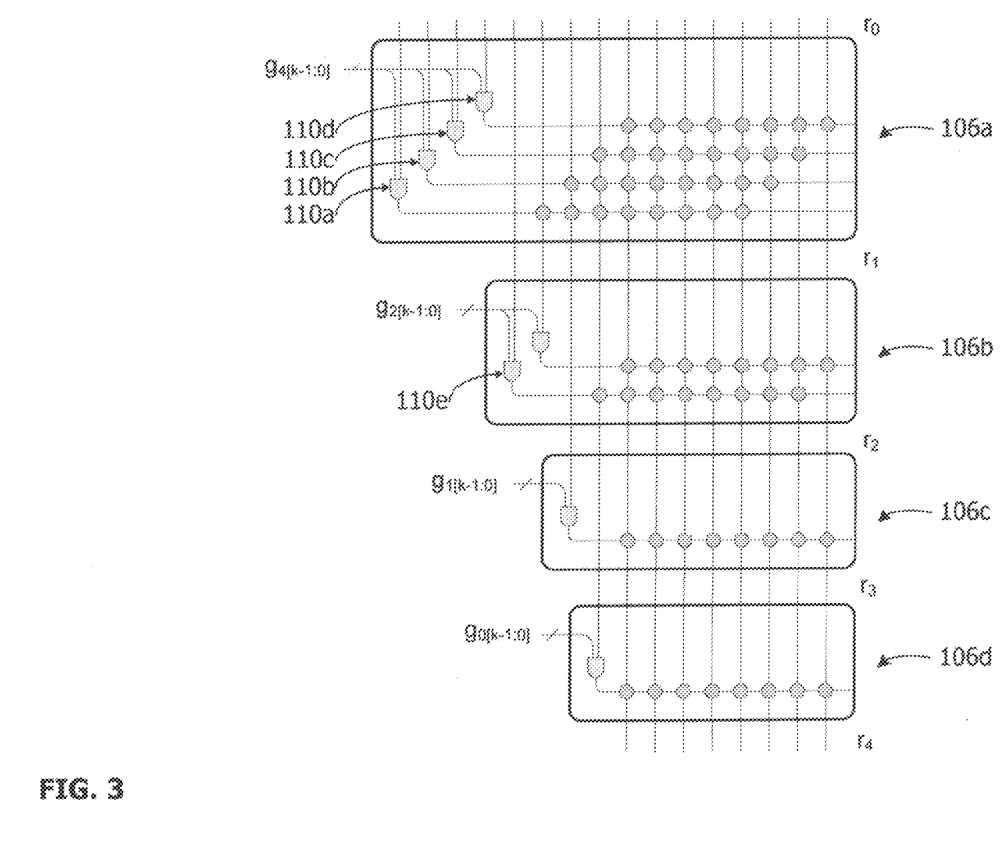
FIG. 3 is a diagram illustrating stages that perform parallel operations on a pre-computed polynomial and input data.

These equations provide an approach to CRC computation that can be implemented in a wide variety of circuitry. For example, FIG. 3 illustrates a high-level architecture of a circuit implementing the approach described above. As shown, a given stage 106a-106d can reduce input data, r, by subtracting a multiple of the k-least significant bits 104 of the pre-computed polynomial $g_i(x)$ from the stage input. Again, the resulting stage output is congruent to the stage input with respect to a CRC calculation though of a smaller width.

The sample implementation shown features stages 106a-106d that AND 110a-110d (e.g., multiply) the k-least significant bits 104 of $g_i(x)$ by respective bits of input data. The i-zeroes 102 and initial "1" of $g_i(x)$ are not needed by the stage since they do not affect the results of stage computation. Thus, only the k-least significant bits of $g_i(x)$ need to be stored by the circuitry.

To illustrate operation, assuming $r_0$ had a value starting "1010..." and the k-least significant bits of $g_4(x)$ had a value of "001010010", the first 110a and third 110c AND gates would output "001010010" while the second 110b and fourth 110d AND gates would output zeros. As indicated by the shaded nodes in FIG. 3, the output of the AND 110a-110d gates can be aligned to shift (i.e., multiply) the gate 110a-110d output in accordance with the respective bit-positions of the input data. That is, the output of the gate 110a operating on the most significant bit of input data is shifted by i−1 bits, and each succeeding gate 110b-110d decrements this shift by 1. For example, the output of gate 110a, corresponding to the most significant bit of $r_0$, is shifted by 3-bits with respect to the input data, the output of gate 110b corresponding to the next most significant bit of $r_0$ is shifted by 2-bits, etc. The input data can then be subtracted (e.g., XOR-ed) by the shifted-alignment of the output of gates 110a-110d. The subtraction result reduces the input data by a number of bits equal to the number of zeroes 102 in the polynomial for i>0. In essence, the i-most significant bits of input data, $r_0$, act as selectors, either causing subtraction of the input data by some multiple of the k-least significant bits of $g_i(x)$ or outputting zeroes that do not alter the input data.

As shown, the AND gates 110a-110d of a stage 106a may operate in parallel since they work on mutually-exclusive portions of the input data. That is, AND gates 110a-110d can each simultaneously process a different bit of $r_0$ in parallel. This parallel processing can significantly speed CRC calculation. Additionally, different stages may also process data in parallel. For example, gate 110e of stage 106b can perform its selection near the very outset of operation since the most significant bit of $r_0$ passes through unaltered to stage 106b.

Figure 4A:
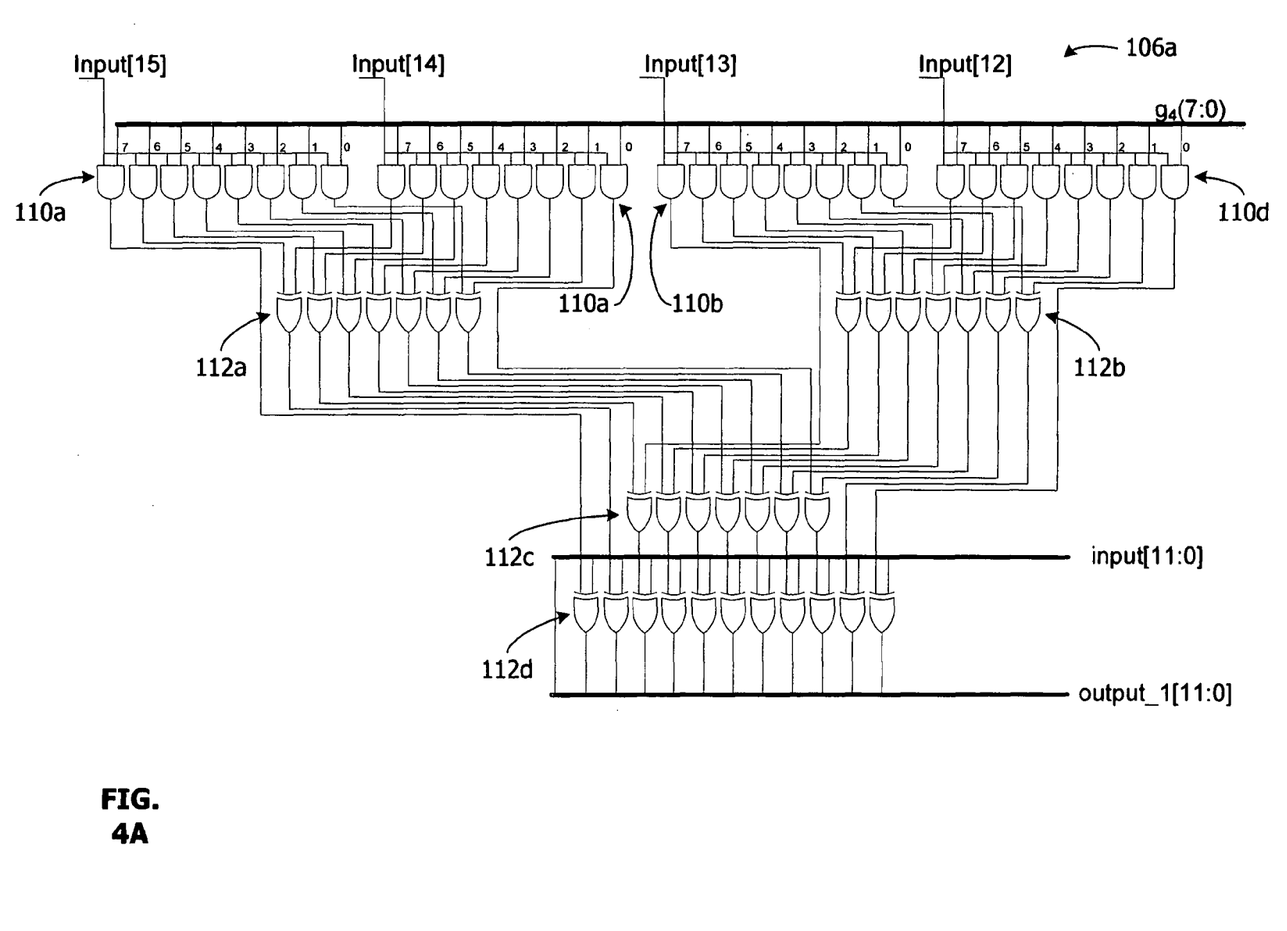
FIGS. 4A and 4B are diagrams of sample stages' digital logic gates.

FIG. 4A depicts digital logic gates of a sample stage 106a implementation conforming to the architecture shown in FIG. 3. In this example, the stage 106a receives a 16-bit input value (e.g., $r_0$=input data [15:0]) and the k-least significant bits of $g_4(x)$. The stage 106a processes the i-th most significant bits of the input value with i-sets of AND gates 110a-110d where each input data bit is ANDed 110a-110d with each of the k-least significant bits of $g_4(x)$. Each set of k-AND gates 110a-110d in FIG. 4A corresponds to the conceptual depiction of a single AND gate in FIG. 3. The output of the AND gate arrays 110a-110d is aligned based on the input data bit position and fed into a tree of XOR gates 112a-112d that subtract the shifted AND gate 110a-110d output from the remaining bits of input data (i.e., the input data less the i-th most significant bits).

Figure 4B:
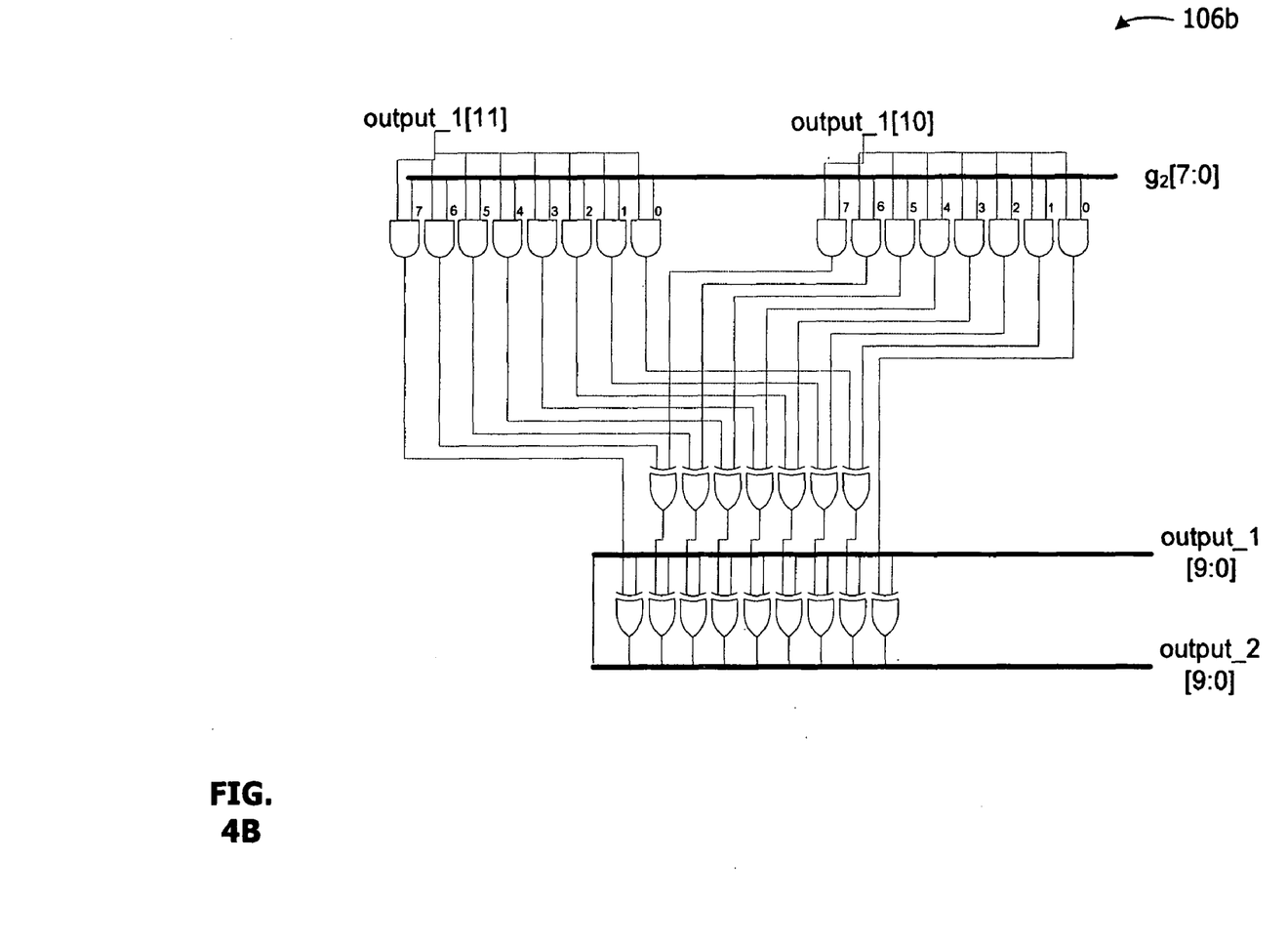

FIG. 4B depicts digital logic gates of a succeeding stage 106b that receives output_1 data [11:0] and generates output_2 data [9:0]. The stage 106b receives the 12-bit value output by stage 106a and uses $g_2(x)$ to reduce the 12-bit value to a CRC congruent 10-bit value. Stages 106a, 106b share the same basic architecture of i-arrays of AND gates that operate on the k-least significant bits of $g_i(x)$ and an XOR tree that subtracts the shifted AND gate output from the stage input to generate the stage output value. Other stages for different values of i can be similarly constructed.

The architecture shown in FIGS. 3, 4A, and 4B are merely examples and a wide variety of other implementations may be used. For example, in the sample FIGS., each stage 106a-106d processed the i-th most significant bits of input data in parallel. In other implementations, a number of bits greater or less than i could be used in parallel, however, this may not succeed in reducing the size of the output data for a given stage.

The architecture shown above may be used in deriving the pre-computed polynomials. For example, derivation can be performed by zeroing the storage elements associated with $g_i(x)$ and loading $g_0$ with the k-least significant bits of the polynomial key. The bits associated with successive $g_i$-s can be determined by applying $x^{k+i}$ as the data input to the circuit and storing the resulting k-least significant bits output by the $g_0$ stage as the value associated with $g_i$. For example, to derive the polynomial for $g_2$, $x^{k+2}$ can be applied as the circuit, the resulting k-bit output of the $g_0$ stage can be loaded as the value of the $g_2$ polynomial.

Figure 5:
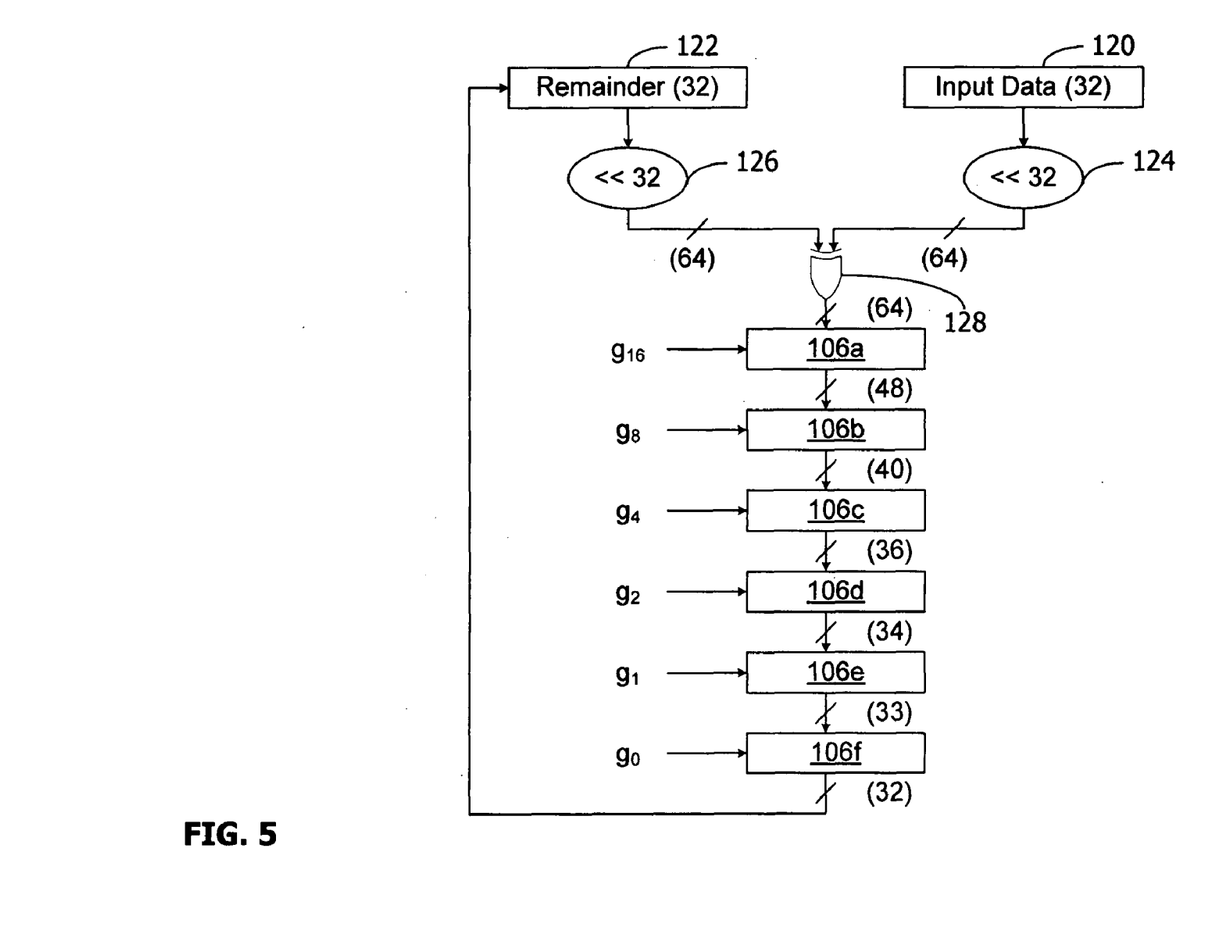
FIG. 5 is a diagram of a system to compute a polynomial division residue.

FIG. 5 depicts a sample CRC implementation using techniques described above. The implementation works on successive portions of a larger message in 32-bit segments 120. As shown, the sample implementation shifts 124, 126 and XORs 128 a given portion 120 of a message by any pre-existing residue 122 and computes the CRC residue using stages 106a-106f and the k-bits of the respective pre-computed polynomials $g_i(x)$. Again, successive stages 106a-106e reduce input data by i-bits until a residue value is output by stage 106f. The circuit then feeds the residue back 122 for use in processing the next message portion 124. The residue remaining after the final message portion 120 is applied is the CRC value determined for the message as a whole. This can either be appended to the message or compared with a received CRC value to determine whether data corruption likely occurred.

The system shown in FIG. 5 featured (L+1) stages 106a-106f where the polynomials were of the form $i=\{0, 2^{n-1}$ for n=1 to L$\}$. However, this strict geometric progression of i is not necessary and other values of i may be used in reducing a message. Additionally, at the lower polynomial levels (e.g., i<4) it may be more efficient to abandon the stage architecture depicted in FIGS. 3, 4A, and 4B and process an input value using $g_0$ in a traditional bit-serial or other fashion.

Techniques described above can be used to improve CRC calculation speed, power efficiency, and circuit footprint. As such, techniques described above may be used in a variety of environments such as network processors, security processors, chipsets, ASICs (Application Specific Integrated Circuits), and as a functional unit within a processor or processor core where the ability to handle high clock speeds, while supporting arbitrary polynomials, is of particular value. As an example, CRC circuitry as described above may be integrated into a device having one or more media access controllers (e.g., Ethernet MACs) coupled to one or more processors/processor cores. Such circuitry may be integrated into the processor itself, in a network interface card (NIC), chipset, as a co-processor, and so forth. The CRC circuitry may operate on data included within a network packet (e.g., the packet header and/or payload). Additionally, while described in conjunction with a CRC calculation, this technique may be applied in a variety of calculations such as other residue calculations over GF(2) (e.g., Elliptic Curve Cryptography).

The term circuitry as used herein includes implementations of hardwired circuitry, digital circuitry, analog circuitry, programmable circuitry, and so forth. The programmable circuitry may operate on computer instructions disposed on a storage medium.

Other embodiments are within the scope of the following claims.

The invention claimed is:

1. A method for use in determining a residue of a message, m(x), the method comprising:
    loading into a set of storage elements at least a portion of each of a set of polynomials derived from a first polynomial, g(x); and
    determining the residue for the message corresponding to m(x) mod g(x) using a set of stages, respective stages in the set of stages comprising digital logic to apply at least a portion of a respective one of the polynomials stored in a respective one of the set of storage elements to a respective input of the stage received from a preceding stage;
    wherein the set of polynomials conform to:

$$g_i(x) = x^{k+i} + [x^{k+i} \bmod g(x)]$$

for multiple values of i, where i and k are integers.

2. The method of claim 1,
    wherein the set of polynomials comprises polynomials having a prefix and a k-bit remainder where k is positive integer, wherein the prefix of a polynomial in the set of polynomials consists of a most significant bit equal to 1 followed by a set of zero or more consecutive zeroes, and wherein zeros in the set of one or more consecutive zeroes increases for successive polynomials in the set.

3. The method of claim 1,
    wherein respective ones of the set of stages receives bits of $r_{i-1}(x)$ and outputs bits of $r_i(x)$, such that $r_i(x) = r_{i-1}(x)$.

4. The method of claim 1,
    further comprising, at least one of: (1) appending the residue to the message for transmission across a network, and (2) comparing the residue to a previously computed residue.

5. The method of claim 1,
    wherein, in individual ones of the stages, at least a portion of a one of the set of polynomials associated with a respective stage undergoes polynomial multiplication by respective bits of input data received by the respective stage.

6. The method of claim 5,
    wherein the respective bits of input data consist of a number of bits equal to a number of zeroes in the set of one or more consecutive zeroes in the respective polynomial prefix.

7. The method of claim 5, where the polynomial multiplication by respective bits of input data occurs in parallel for the respective bits of input data.

8. An apparatus for use in determining a residue of a message, m, with respect to a first polynomial, g(x), over a finite field, GF(2), the apparatus comprising:
    a set of storage elements to store at least a portion of each of a set of polynomials derived from the first polynomial, g(x); and
    a set of stages coupled to respective ones of the set of storage elements, respective stages in the set of stages comprising digital logic gates to apply at least a portion of a respective one of the polynomials stored in a respective one of the set of storage elements to a respective input of the stage received from a preceding stage, the determined residue for the message, m, being based on output of a last of the set of stages;
    wherein the set of polynomials conform to:

$$g_i(x) = x^{k+i} + [x^{k+i} \bmod g(x)]$$

for multiple values of i, where i and k are integers.

9. The apparatus of claim 8,
wherein the set of polynomials comprises polynomials having a prefix and a k-bit remainder where k is a positive integer, wherein the prefix of a polynomial in the set consists of a most significant bit equal to 1 followed by a set of zero or more consecutive zeroes, and wherein a number of consecutive zeroes in the set of zero or more zeroes increases for successive polynomials in the set.

10. The apparatus of claim 8,
wherein respective ones of the set of stages receives bits of $r_{i-1}(x)$ and outputs bits of $r_i(x)$, such that $r_i(x)=r_{i-1}(x)$.

11. The apparatus of claim 9,
wherein in individual ones of the set of stages, the respective polynomial k-bit remainder associated with a respective stage is fed into AND gates with input data bits of the respective stage.

12. The apparatus of claim 11,
wherein the respective input data bits fed into the AND gates consist of a number of bits equal to a number of consecutive zeroes in the respective polynomial prefix set of zero or more consecutive zeroes.

13. The apparatus of claim 11,
wherein the digital logic gates comprise a tree of exclusive-or (XOR) gates coupled to the output of the AND gates and the least significant bits of the stage input data.

14. The apparatus of claim 8,
further comprising circuitry to load new values of the set of polynomials into the storage elements.

15. A device, comprising:
at least one media access controller (MAC) to receive a message from a network;
at least one processor communicatively coupled to the at least one media access controller;
the device including circuitry to determine a residue of the message with respect to a first polynomial, g(x), over a finite field, GF(2), the circuitry comprising:
a set of storage elements to store a set of polynomials derived from the first polynomial, g(x); and
a set of stages coupled to respective ones of the set of storage elements, respective stages in the set of stages comprising digital logic gates to apply at least a portion of a respective one of the polynomials stored in a respective one of the set of storage elements to a respective input of the respective stage received from a preceding stage, the determined residue for the message, m, being based on output of a last of the set of stages;
wherein the set of polynomials conform to:

$$g_i(x)=x^{k+i}+[x^{k+i} \bmod g(x)]$$

for multiple values of i, where i and k are integers.

16. The device of claim 15,
wherein the set of polynomials comprises polynomials having a prefix and a k-bit remainder where k is a positive integer, wherein the prefix of a polynomial in the set consists of a most significant bit equal to 1 followed by a set of zero or more consecutive zeroes, and wherein a number of consecutive zeroes in the set of zero or more consecutive zeroes increases for successive polynomials in the set.

17. The device of claim 15,
wherein in individual ones of the set of stages, the respective polynomial k-bit remainder associated with a respective stage are fed into AND gates with input data bits of the respective stage; and
wherein the respective input data bits fed into the AND gates consist of a number of bits equal to the number of successive zeroes in the respective polynomial prefix set of zero or more consecutive zeroes.

* * * * *